(12) United States Patent
Kondo et al.

(10) Patent No.: US 10,354,844 B2
(45) Date of Patent: Jul. 16, 2019

(54) INSULATOR STRUCTURE FOR AVOIDING ABNORMAL ELECTRICAL DISCHARGE AND PLASMA CONCENTRATION

(71) Applicant: ASM IP HOLDING B.V., Almere (NL)

(72) Inventors: Hiroshi Kondo, Sagamihara (JP); Masaki Hirayama, Sendai (JP)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 15/594,445

(22) Filed: May 12, 2017

(65) Prior Publication Data
US 2018/0330924 A1 Nov. 15, 2018

(51) Int. Cl.
*H01J 37/32* (2006.01)

(52) U.S. Cl.
CPC .... *H01J 37/32568* (2013.01); *H01J 37/3244* (2013.01); *H01J 37/32082* (2013.01); *H01J 2237/334* (2013.01); *H01J 2237/3321* (2013.01)

(58) Field of Classification Search
None
See application file for complete search history.

(56) References Cited

U.S. PATENT DOCUMENTS

| | | |
|---|---|---|
| 5,494,522 A | 2/1996 | Moriya et al. |
| 5,578,129 A | 11/1996 | Moriya |
| 5,919,332 A | 7/1999 | Koshiishi et al. |
| 6,129,806 A | 10/2000 | Kaji et al. |
| 6,197,151 B1 | 3/2001 | Kaji et al. |
| 6,902,683 B1 | 6/2005 | Kaji et al. |
| 2002/0069971 A1 | 6/2002 | Kaji et al. |
| 2004/0178180 A1 | 9/2004 | Kaji et al. |
| 2005/0082006 A1 | 4/2005 | Kaji et al. |
| 2006/0144518 A1 | 7/2006 | Kaji et al. |
| 2008/0180357 A1 | 7/2008 | Kawakami et al. |
| 2013/0082197 A1* | 4/2013 | Yang .................. H01J 37/32091 250/505.1 |
| 2014/0116620 A1* | 5/2014 | Kuwabara ............. C23C 16/509 156/345.24 |
| 2016/0042920 A1* | 2/2016 | Cho .................... H01J 37/3255 315/111.21 |

FOREIGN PATENT DOCUMENTS

| | | |
|---|---|---|
| EP | 1780777 | 5/2007 |
| EP | 2479782 | 7/2012 |
| EP | 2479783 | 7/2012 |

(Continued)

*Primary Examiner* — Joseph L Williams
*Assistant Examiner* — Jacob R Stern
(74) *Attorney, Agent, or Firm* — Pillsbury Winthrop Shaw Pittman LLP

(57) ABSTRACT

An insulator for a processing apparatus including an upper electrode, a lower electrode and a reaction chamber, the insulator being adapted to be arranged around the upper electrode and the insulator including: a bottom end adapted to face the reaction chamber; and a side wall facing a side wall of the upper electrode, wherein an edge portion of the bottom end of the insulator extends radially inwardly to form a projecting portion such that the projecting portion covers an edge of a bottom surface of the upper electrode and a clearance between the side wall of the upper electrode and the side wall of the insulator.

20 Claims, 10 Drawing Sheets

(56) References Cited

FOREIGN PATENT DOCUMENTS

| | | |
|---|---|---|
| EP | 2479784 | 7/2012 |
| EP | 3128538 | 2/2017 |
| JP | 06-283474 | 10/1994 |
| JP | 08-339984 | 12/1996 |
| JP | 09-055374 | 2/1997 |
| JP | 10-032192 | 2/1998 |
| JP | 11-312672 | 11/1999 |
| JP | 2002-100619 | 4/2002 |
| JP | 2005-045291 | 2/2005 |
| JP | 2008-182081 | 8/2008 |
| JP | 2011-017088 | 1/2011 |
| JP | 2011-049592 | 3/2011 |
| JP | 2012-222270 | 11/2012 |

* cited by examiner

INSULATOR STRUCTURE FOR AVOIDING ABNORMAL ELECTRICAL DISCHARGE AND PLASMA CONCENTRATION

FIELD

The present description relates generally to an apparatus used in a semiconductor or liquid-crystal plate manufacturing process, in particular to a plasma deposition or etching apparatus.

BACKGROUND

As part of a semiconductor or liquid-crystal plate manufacturing process, plasma enhanced chemical vapor deposition (PECVD) and plasma enhanced atomic layer deposition (PEALD) processes are generally used to deposit one or more films on a patterned surface of a workpiece, such as a semiconductor substrate. Those processes are typically accomplished by introducing a precursor gas or gas mixture into a chamber that contains a workpiece. The precursor gas or gas mixture is usually directed downwardly via a shower plate located at the top of the chamber.

SUMMARY

FIG. 1 shows an overview of an example PECVD apparatus 1 showing an insulator structure. In FIG. 1, an upper electrode 12 and a shield plate 13 are fixed to one another with one or more screws 25, and an O-ring 14 is provided between the upper electrode 12 and the shield plate 13. The upper electrode 12 is surrounded peripherally (e.g., circumferentially) by the insulator 34 with a certain clearance. A chamber wall 11, the bottom end of the upper electrode 12 and the bottom end of the insulator 34 in part define a vacuum (reaction) chamber 10. Conventionally, as in FIG. 1, the position of the edge of the bottom surface of the insulator 34 is set to 3 millimeters or more above the position of the edge of the bottom surface of the upper electrode 12 in a direction perpendicular to the bottom surface of the upper electrode 12 or the top surface of the lower electrode 5.

During the deposition process, an abnormal electrical discharge and plasma concentration tends to occur near the edge of the bottom end of the upper electrode 12, the edge of the bottom end of the insulator 34 and a clearance between the side wall of the upper electrode 12 and the side wall of the insulator 34. It was found that this abnormal electrical discharge and plasma concentration around those edges or the clearance have in fact a negative impact on the quality of film to be deposited on the surface of a substrate. FIG. 2 shows an enlarged schematic view of a portion of an example PECVD apparatus in which areas of abnormal electric discharge and plasma concentration 60 and an area of normal electrical discharge (regular electrical discharge) 70 and an area of a sheath 80 (e.g., ion sheath) are shown during the deposition process.

It was found that the occurrence of such phenomena is caused at least in large part by a steep change in terms of the position, i.e., 3 millimeters or more, in the vertical direction from the edge of the bottom surface of the upper electrode 12 to the edge of the bottom surface of the insulator 34, or by a clearance between the side wall of the upper electrode 12 and the side wall of the insulator 34 that is normally necessary to compensate for the expansion of the upper electrode 12 and/or the side wall of the insulator 34 at a higher temperature during the deposition process.

An object of an embodiment described herein is to provide an insulator structure 34 (and the shape of the edge of the upper electrode 12) that can effectively reduce or minimize the occurrence of such an abnormal electrical discharge and plasma concentration around those edges and/or the clearance, and thus lessen the negative impact on the quality of the film to be deposited.

In an aspect, there is provided an insulator for a processing apparatus comprising an upper electrode, a lower electrode and a reaction chamber, the insulator being adapted to be arranged around the upper electrode and the insulator comprising: a bottom end adapted to face the reaction chamber; and a side wall facing a side wall of the upper electrode, wherein an edge portion of the bottom end of the insulator extends radially inwardly to form a projecting portion such that the projecting portion covers an edge of a bottom surface of the upper electrode and a clearance between the side wall of the upper electrode and the side wall of the insulator.

In some embodiments, there is provided a processing apparatus comprising: an upper electrode; a lower electrode; a workpiece support; a reaction chamber; and an insulator arranged around the upper electrode, the insulator comprising: a bottom end adapted to face the reaction chamber; and a side wall facing a side wall of the upper electrode, wherein an edge portion of the bottom end of the insulator extends radially inwardly to form a projecting portion such that the projecting portion covers an edge of a bottom surface of the upper electrode and a clearance between the side wall of the upper electrode and the side wall of the insulator.

For purposes of summarizing aspects of the invention and one or more advantages achieved over the related art, certain objects and advantages are described in this disclosure. Of course, it is to be understood that not necessarily all or any such objects or advantages may be achieved in accordance with any particular embodiment. Thus, for example, those skilled in the art will recognize that the invention may be embodied or carried out in a manner that achieves or optimizes one advantage or group of advantages as taught herein without necessarily achieving one or more other objects or advantages as may be taught or suggested herein. Further aspects, features and advantages of this invention will become apparent from the detailed description which follows.

These and other objects, features, and characteristics of the system and/or method disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a", "an", and "the" include plural referents unless the context clearly dictates otherwise.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not necessarily to scale.

DETAILED DESCRIPTION

The present invention includes, but is not limited to, the following embodiments.

Embodiments of the present invention generally apply to an insulator structure of an apparatus to perform a semiconductor or liquid-crystal plate manufacturing process. As an example of such a manufacturing process, PECVD processes are explained to better understand how the apparatus is used to deposit film and how the insulation structure can reduce, minimize or avoid the occurrence of an abnormal electrical discharge and plasma concentration that negatively impacts on the quality of film to be deposited on a substrate. Needless to say, the insulator structure can alternatively or additionally be used for an apparatus that performs a PEALD process, an etching process, etc. So, embodiments of the present invention are not intended to limit the use to apparatuses performing PECVD, PEALD, etc. processes. Next, a configuration of a plasma deposition apparatus is explained in detail below.

Figure 3:
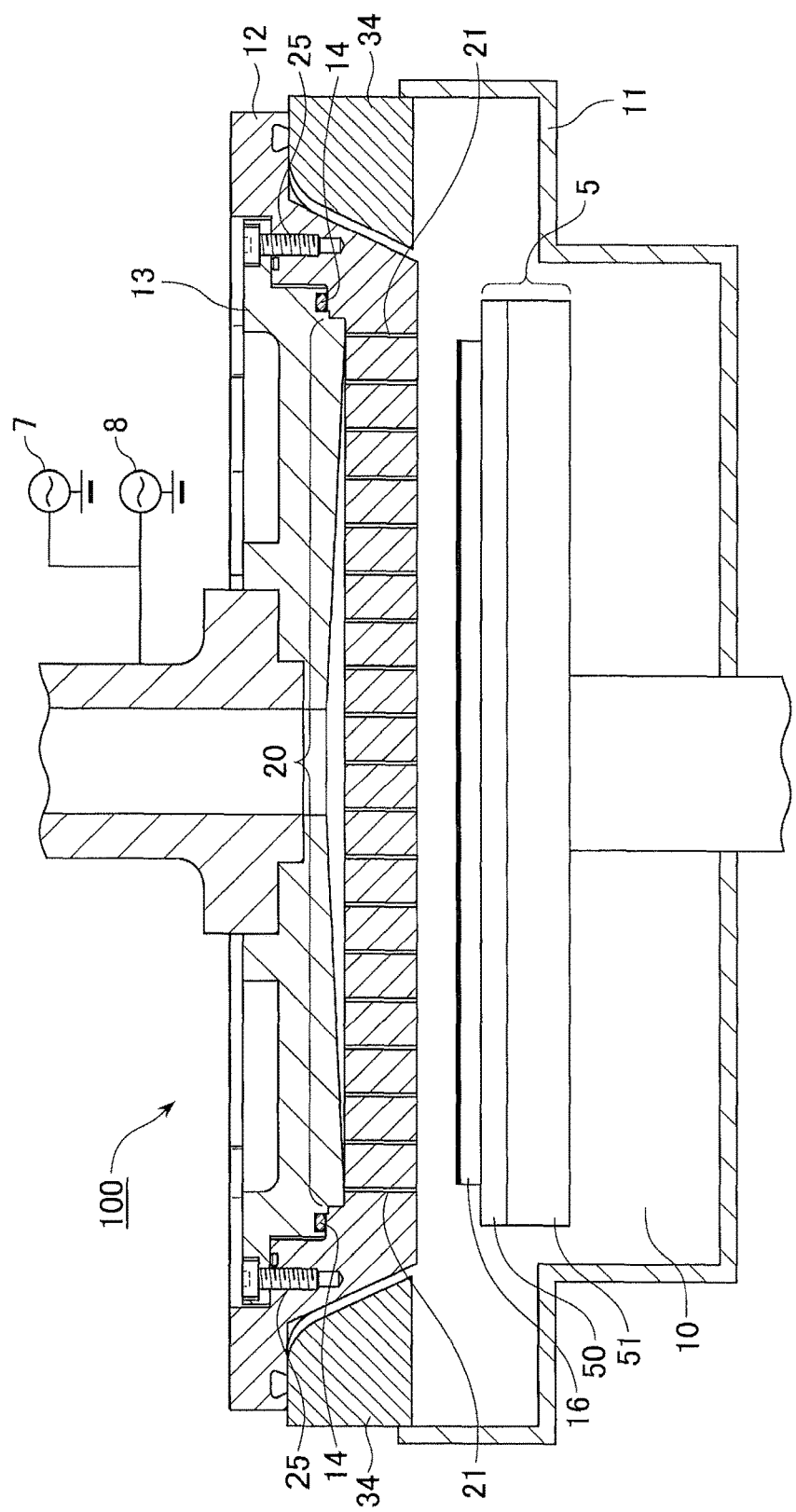
FIG. 3 is a schematic view of a PECVD apparatus showing an insulator structure according to an embodiment.

As an example of a plasma deposition apparatus, FIG. 3 shows a schematic view of a PECVD apparatus 100 according to an embodiment. As shown in FIG. 3, the PECVD apparatus 100 comprises a vacuum (reaction) chamber 10 defined at least in part by a chamber wall 11, an upper electrode (a first electrode) 12 provided at the top of the vacuum chamber 10, and an insulator 34 provided around the upper electrode 12 which insulates the upper electrode 12 from the vacuum chamber 10. A lower electrode (a second electrode) 5 is provided inside the vacuum chamber 10 substantially parallel to the upper electrode 12. RF power sources 7 and 8 are connected to a gas duct attached to the upper electrode 12. The vacuum chamber 10 has an opening with an exhaust valve (not shown) at its side portion and comprises an exhaust duct (not shown) connected to an exhaust pump (not shown). Additionally, the vacuum chamber 10 is grounded and insulated by the insulator 34 from the upper electrode 12. The vacuum chamber 10 also has an opening with a gate valve (not shown) on an inner side wall for workpiece (e.g., substrate) transfer.

At the bottom face of the upper electrode 12, a shower plate structure is formed. In the shower plate, many gas outlet apertures 21 (holes or pores within a region (e.g., circular region) 20 of the shower plate structure) as illustrated in FIG. 3 are formed so that a jet of a source gas introduced from the gas inlet port is emitted from the apertures toward the lower electrode 5. The lower electrode 5 has a susceptor 50 and a heater 51 attached to the susceptor 50 at the lower end of the lower electrode 5. The susceptor 50 is disposed substantially parallel to the upper electrode 12 and holds a workpiece (e.g., substrate) 16 placed on its upper surface.

In FIG. 3, the upper electrode 12 and the shield plate 13 are fixed to one another with one or more screws 25, and an O-ring 14 is provided between the upper electrode 12 and the shield plate 13. In one embodiment, the upper electrode 12 is surrounded peripherally (e.g., circumferentially) by the insulator 34 with a certain clearance, e.g., between the side wall of the upper electrode 12 and the adjacent side wall of the insulator 34. The chamber wall 11, the bottom end of the upper electrode 12 and the bottom end of the insulator 34 at least in part define the vacuum (reaction) chamber 10.

During the deposition process, an abnormal electrical discharge and plasma concentration tends to occur near the edge of the bottom end of the upper electrode 12, and at a clearance between the side wall of the upper electrode and the side wall of the insulator 34 (and at the edge of the bottom end of the insulator 34). This abnormal electrical discharge and plasma concentration has a negative impact on the quality of film to be deposited on the surface of a substrate. However, by forming a smoother surface comprised of the bottom surface of the upper electrode 12 and the bottom surface of the insulator 34 it is found out that it becomes possible to effectively reduce or minimize the occurrence of such an abnormal electrical discharge and plasma concentration around those edges, and thus lessen the negative impact on the quality of the deposited film.

In one embodiment, as in FIG. 3, if the position of the edge of the bottom surface of the insulator 34 becomes less than 3 millimeters (e.g., about 2 millimeters) above the position of the edge of the bottom surface of the upper electrode 12 in a vertical direction (e.g., in a direction perpendicular to the bottom surface of the upper electrode 12 or to the top surface of the lower electrode 5), it is found out that it can substantially eliminate the negative effect on the quality of deposited film caused by an abnormal electrical discharge and plasma concentration around those edges.

In one embodiment, as in FIG. 4, if the position of the edge of the bottom surface of the insulator 34 becomes less than 3 millimeters (e.g., 2 millimeters) below the position of the edge of the bottom surface of the upper electrode 12 in a vertical direction (e.g., in a direction perpendicular to the bottom surface of the upper electrode 12 or the top surface of the lower electrode 5), it is found out that it can substantially eliminate the negative effect on the quality of deposited film caused by an abnormal electrical discharge and plasma concentration around those edges.

Figure 5:
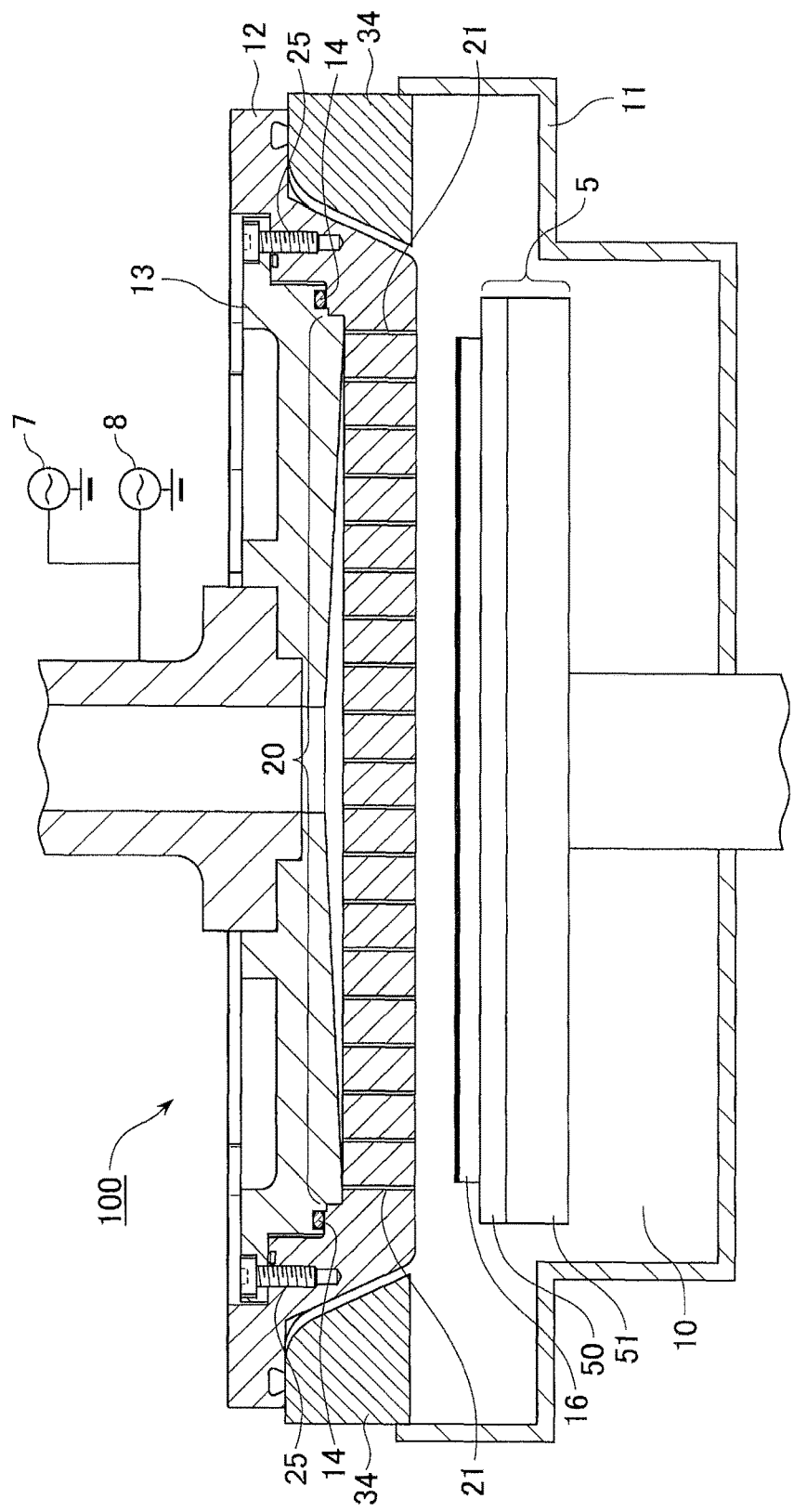
FIG. 5 is a schematic view of a PECVD apparatus showing an insulator structure according to an embodiment.

In FIG. 5, the basic configurations of the apparatus are the same as in FIG. 3 except that the edge of the bottom surface of the upper electrode 12 is rounded or chamfered (with a radius selected from the range of about 0.05 to about 10 millimeters). The range of the radius can be determined based upon the thickness of the area of the sheath (e.g., the ion sheath 80) formed between the upper electrode 12 and the lower electrode 5. The radius is made to be the same as or more than the thickness of the sheath area (e.g., 0.05 millimeters). In one embodiment, as in FIG. 5, if the edge of the bottom surface of the upper electrode 12 is rounded or chamfered with a radius selected from the range of about 0.05 to about 10 millimeters, and the position of the edge of the bottom surface of the insulator 34 is less than 3 millimeters (e.g., about 2 millimeters) above the position of the edge of the bottom surface of the upper electrode 12 in the vertical direction (e.g., in a direction perpendicular to the bottom surface of the upper electrode 12 or the top surface of the lower electrode 5), it is found out that it can more substantially eliminate the negative effect on the quality of deposited film caused by an abnormal electrical discharge and plasma concentration around those edges.

Figure 4:
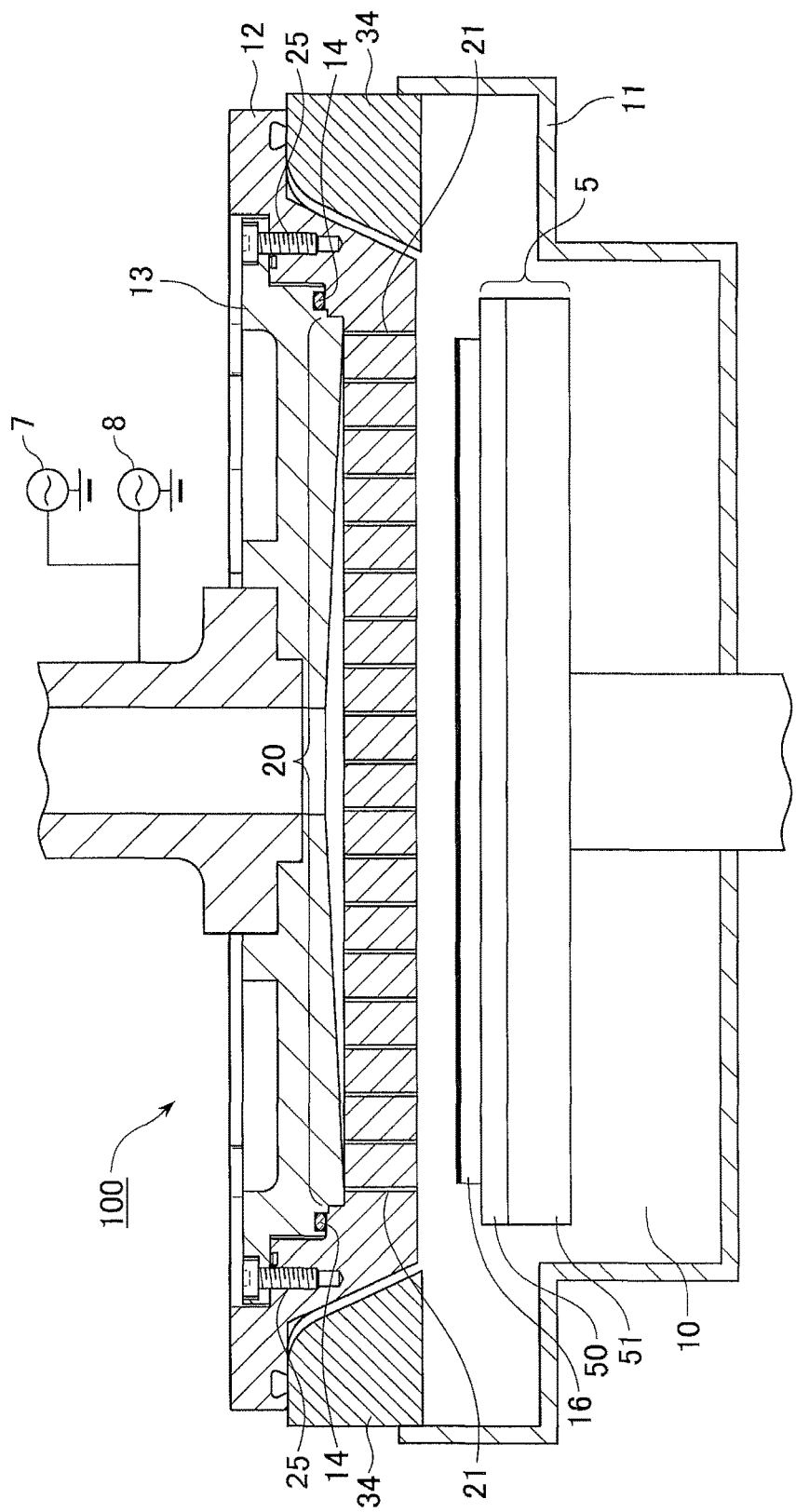
FIG. 4 is a schematic view of a PECVD apparatus showing an insulator structure according to an embodiment.
Figure 6:
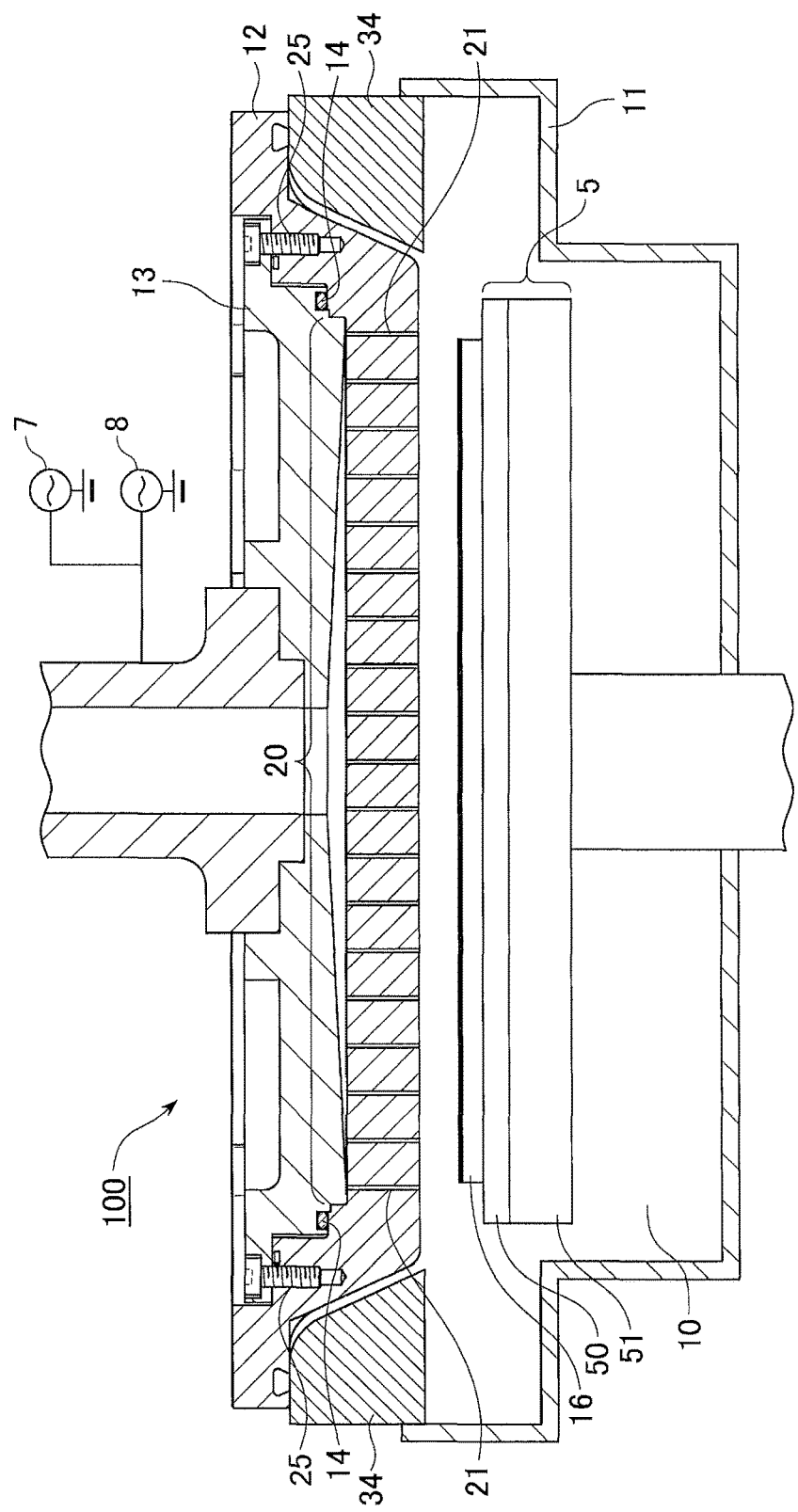
FIG. 6 is a schematic view of a PECVD apparatus showing an insulator structure according to an embodiment.

In FIG. 6, the basic configurations of the apparatus are the same as in FIG. 4 except that the edge of the bottom surface of the upper electrode is rounded or chamfered (with a radius selected from the range of about 0.05 to about 10 millimeters). The range of the radius can be determined based upon the thickness of the area of the sheath (e.g., the ion sheath 80) formed between the upper electrode 12 and the lower electrode 5. The radius is made to be the same as or more than the thickness of the sheath area (e.g., 0.05 millimeters). In one embodiment, as in FIG. 6, if the edge of the bottom surface of the upper electrode 12 is rounded or chamfered with a radius selected from the range of about 0.05 to about 10 millimeters, and the position of the edge of the bottom surface of the insulator 34 is less than 3 millimeters (e.g., about 2 millimeters) below the position of the edge of the bottom surface of the upper electrode 12 in a vertical direction (e.g., in a direction perpendicular to the bottom surface of the upper electrode 12 or the top surface of the lower electrode 5), it is found out that it can more substantially eliminate the negative effect on the quality of deposited film caused by abnormal electrical discharge and plasma concentration around those edges.

Figure 7:
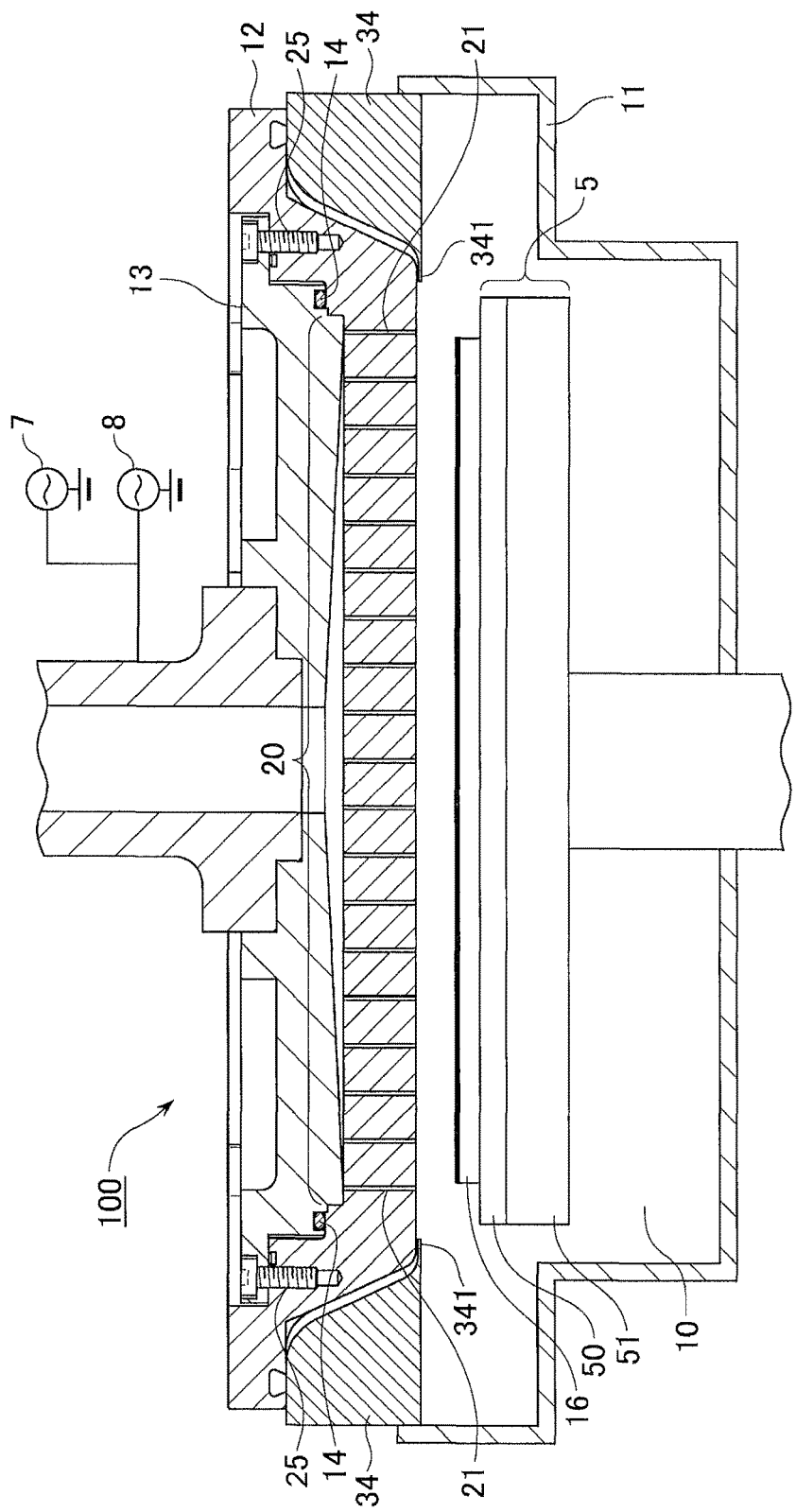
FIG. 7 is a schematic view of a PECVD apparatus showing an insulator structure according to an embodiment.

In FIG. 7, the basic configurations of the apparatus are basically the same as in FIG. 6 including that the edge of the bottom surface of the upper electrode is rounded or chamfered (with a radius selected from the range of about 0.05 to about 10 millimeters), except for the insulator structure. As in FIG. 4, in this embodiment, it is possible to not to have the edge of the bottom surface of the upper electrode 12 be rounded or chamfered as shown in FIG. 7.

Figure 8:
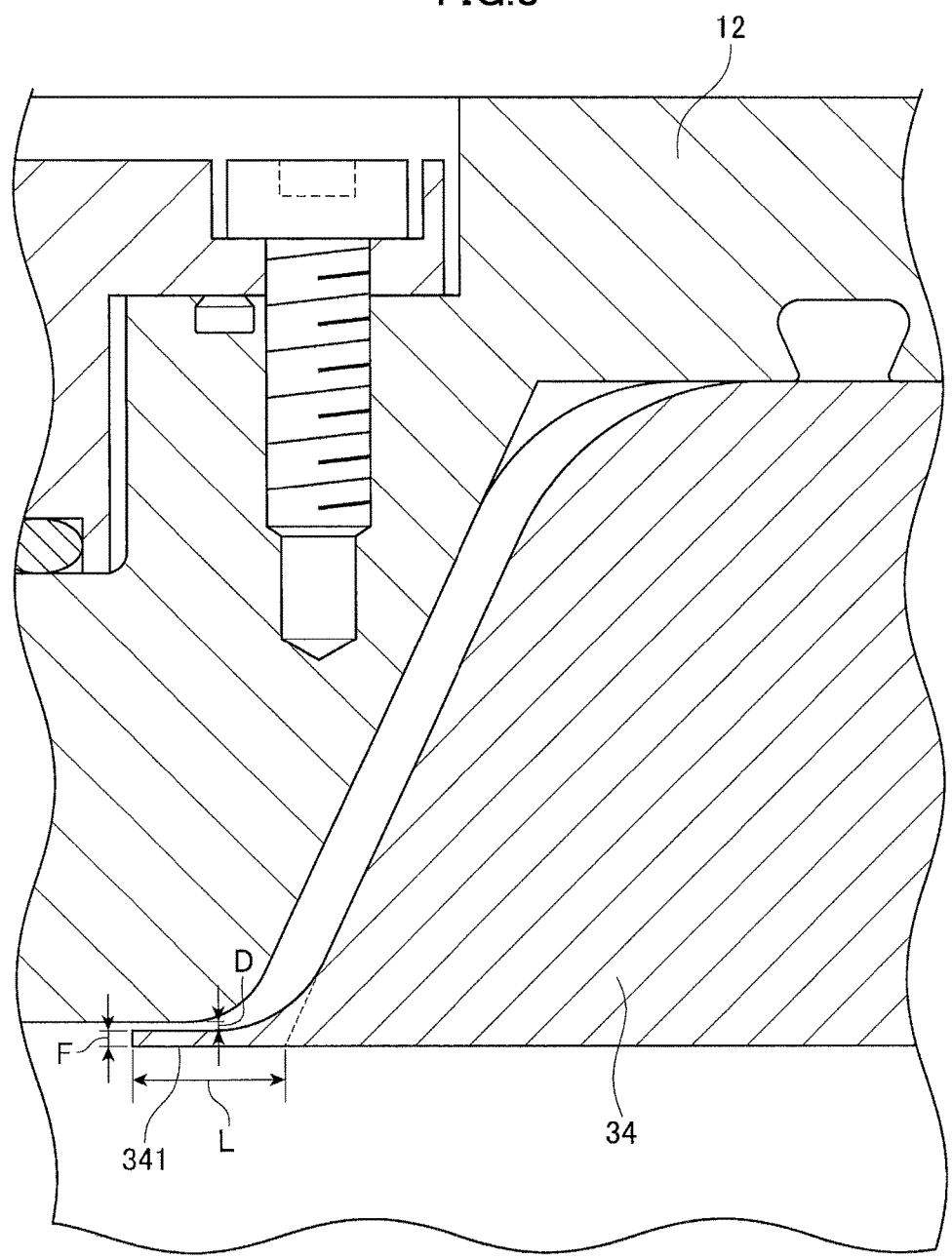
FIG. 8 is an enlarged schematic view of an insulator and part of an upper electrode of a PECVD apparatus according to an embodiment.

In an embodiment, as shown in FIG. 7, differing from the insulator 34 as depicted in FIG. 6, the edge portion of the bottom side of the insulator 34 extends a distance (L) selected from about 5 mm to about 25 millimeters radially inwardly compared to the edge portion of the bottom surface of the insulator 34 as depicted in FIG. 6 to form a projecting portion 341. FIG. 8 shows an enlarged schematic view of the insulator 34 and part of the upper electrode 12. As shown in FIG. 8, the projecting portion 341 whose edge has a thickness (F) selected from the range of about 0.5 to about 2.0 millimeters is formed such that the projecting portion 341 can cover an edge of the bottom side of the upper electrode 12 and have a clearance between the side wall of the upper electrode 12 and the side wall of the insulator 34. In FIG. 8, the distance (D) between the bottom surface of the upper electrode 12 and the top end surface of the projecting portion 341 is set to a distance selected from the range of about 0.1 to about 1.0 millimeter.

In this embodiment, as shown in FIG. 7, where the edge of the bottom surface of the upper electrode 12 is rounded or chamfered with a radius selected from the range of about 0.05 to about 10 millimeters, and the position of the edge of the bottom surface of the insulator 34 becomes a distance selected from the range of about 0.6 to about 3.0 millimeters below the position of the edge of the bottom surface of the upper electrode 12 in a direction perpendicular to the bottom surface of the upper electrode 12 or the top surface of the lower electrode 5, it is found out that it can almost completely eliminate the negative effect on the quality of deposited film caused by an abnormal electrical discharge and plasma concentration around those edges.

Embodiments of the present invention will be explained in detail with reference to specific examples which are not intended to limit the present invention. The numerical numbers applied in specific examples may be modified by a range of at least ±50%, wherein the endpoints of the ranges may be included or excluded.

EXAMPLES

An embodiment of the present invention will now be explained with reference to the following examples, which is not intended to limit the scope of the present invention.

Example 1

Figure 1:
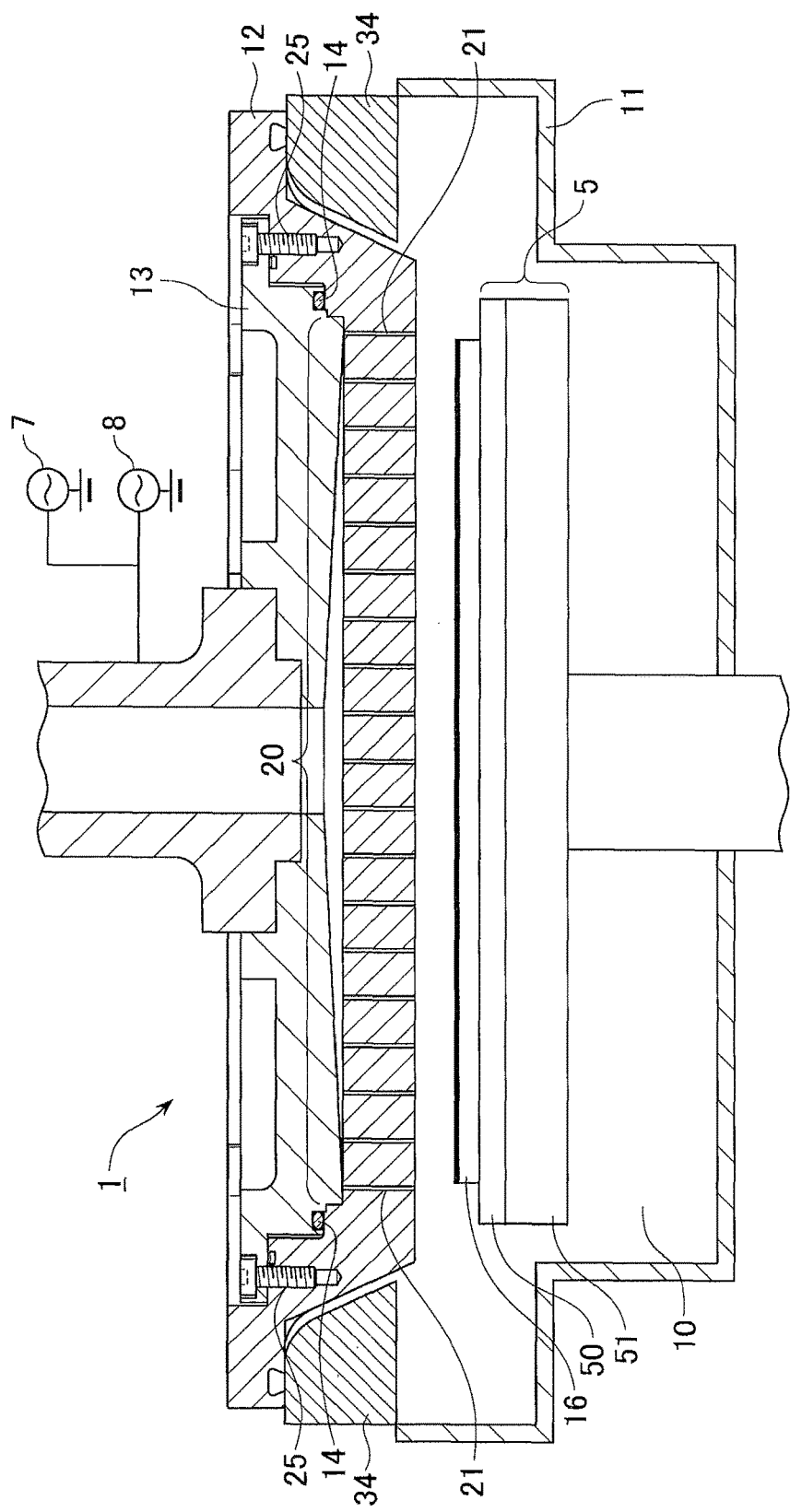
FIG. 1 is a schematic view of an example PECVD apparatus showing a basic insulator structure.
Figure 2:
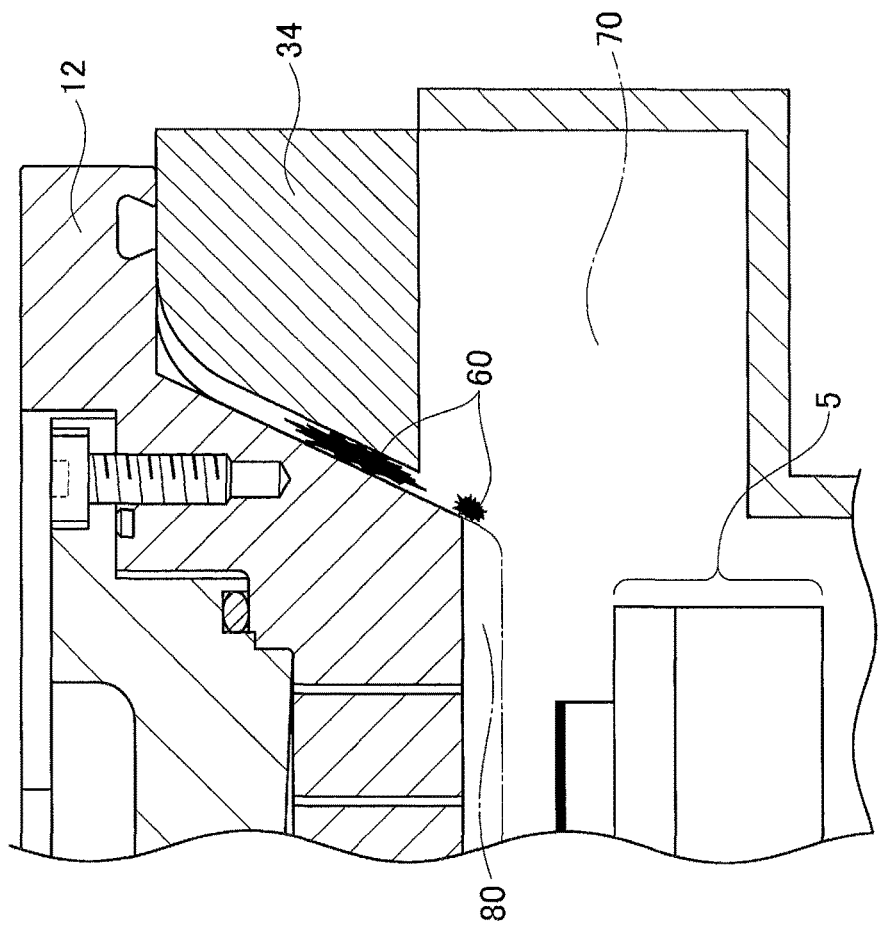
FIG. 2 is an enlarged schematic view of an example PECVD apparatus showing occurrence of an abnormal electric discharge and plasma concentration.

Insulator structure as depicted in FIGS. 1, 3 and 4

A schematic view of an embodiment of an insulator structure for this example is shown in FIGS. 1, 3 and 4. In FIG. 1, the position of the edge of the bottom surface of the insulator 34 is 3 millimeters above the position of the edge of the bottom surface of the upper electrode 12 in the vertical direction.

Figure 9:
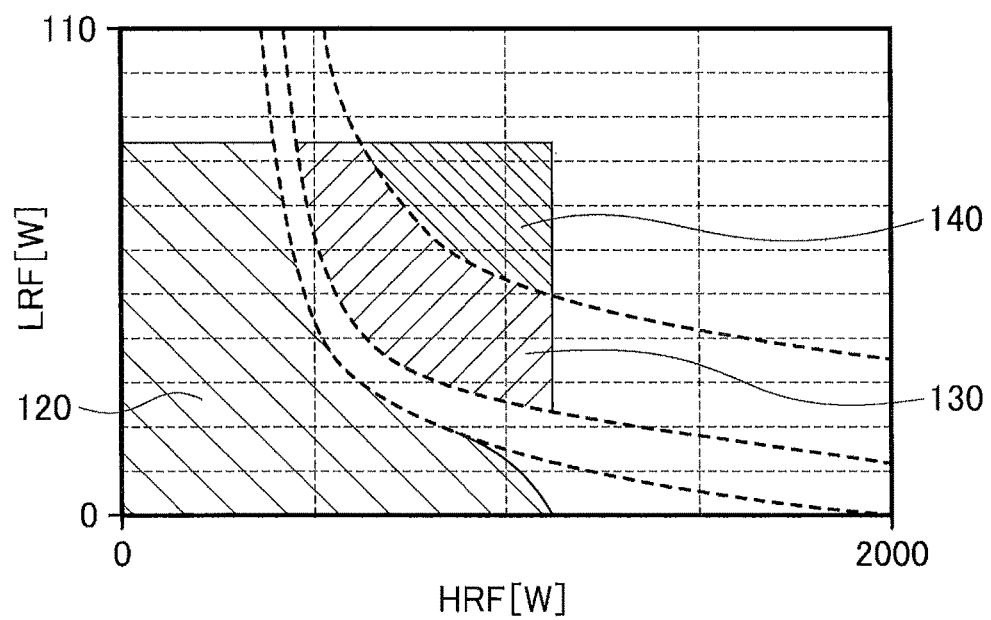
FIG. 9 is a graph showing the occurrence of an abnormal electric discharge and plasma concentration depending on each of HRF and LRF power according to an insulator structure of a conventional PECVD apparatus.

In this example, a SiOC film was deposited on a substrate having recesses or grooves, and a capacitively coupled plasma (CCP) device was used as the CVD apparatus. The film deposition conditions were as follows:
Film deposition pressure: 480 Pa
Precursor: Si-containing precursor
Deposition time: 60 seconds
Flow rate of He: 300 sccm
Flow rate of $O_2$: 40 sccm
HRF power (27 MHz): 1000-1800 W
LRF power (300 kHz): 0-100 W FIG. 9 shows a graph showing whether the occurrence of an abnormal electric discharge and plasma concentration is none or within the acceptable range for each of HRF (high-frequency RF power) and LRF power (low-frequency RF power). The HRF power ranges from 0 [W] to 2000 [W], and the LRF power ranges from 0 [W] to 110 [W]. While an area 120 shown therein denotes that the occurrence of an abnormal electric discharge and plasma concentration is zero or sufficiently low that it does not have a negative impact on the film quality, an area 130 shown therein denotes the occurrence is outside of an acceptable range (e.g., the film quality becomes unstable), and an area 140 shown therein denotes the occurrence is clearly within an unacceptable range (e.g., the film quality becomes unacceptable). When the insulator structure is as depicted in FIG. 1, there is an area, i.e., the area 140, where an abnormal electric discharge and plasma concentration occurs.

On the other hand, if the insulator structure is as depicted in FIG. 3 or FIG. 4, i.e., if the position of the edge of the bottom surface of the insulator 34 is 2 millimeters above or below the position of the edge of the bottom surface of the upper electrode 12 in the vertical direction, the area 120 is expanded and the area 130 is decreased, but the area 140 disappears. Although not shown in the form of a graph, in either of the above two cases (i.e., FIG. 3 or FIG. 4 embodiments), it was confirmed that it substantially eliminated the negative effect on the quality of deposited film caused by an abnormal electrical discharge and plasma concentration around those edges.

Example 2

Insulator structure as depicted in FIGS. 5 and 6

A schematic view of an embodiment of an insulator structure for this example is shown in FIGS. 5 and 6. In this example, the position of the edge of the bottom surface of the insulator 34 is set to 2 millimeters above or below the position of the edge of the bottom surface of the upper electrode 12 in the vertical direction, and the edge of the bottom surface of the upper electrode 12 is in either case rounded or chamfered with a radius, in this case, of 5 millimeters.

Figure 10:
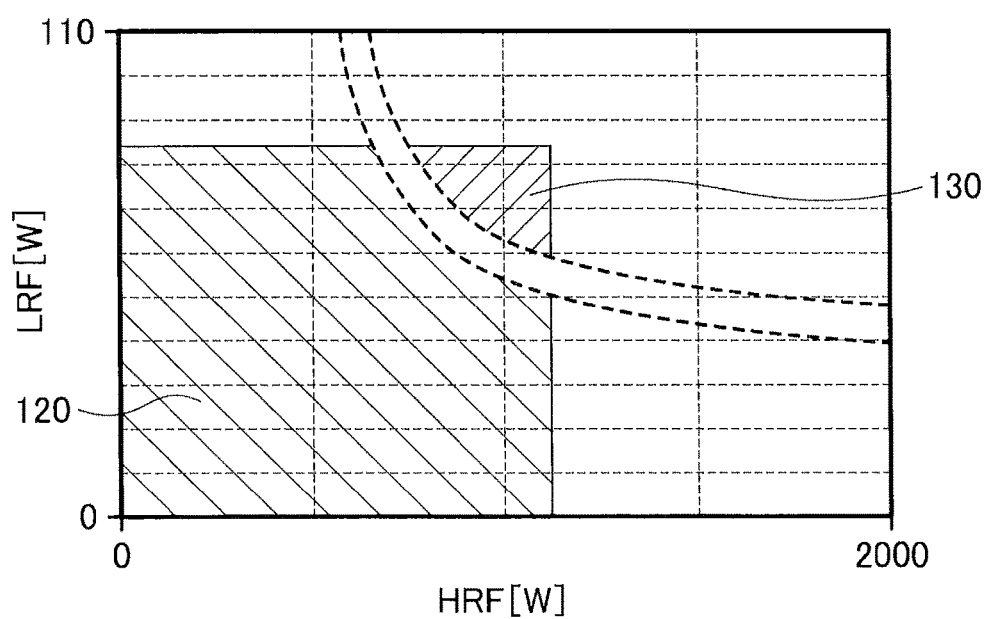
FIG. 10 is a graph showing the occurrence of an abnormal electric discharge and plasma concentration depending on each of HRF and LRF power according to an insulator structure of an embodiment.

In this example, a silicon nitride film was deposited on a substrate having recesses or grooves, and a capacitively coupled plasma (CCP) device was used as the ALD apparatus. The film deposition conditions were as follows:
Film deposition pressure: 480 Pa
Precursor: Si-containing precursor
Deposition time: 60 seconds
Flow rate of He: 300 sccm
Flow rate of $O_2$: 40 sccm
HRF power (27 MHz): 1000-1800 W
LRF power (300 kHz): 0-100 W FIG. 10 shows a graph showing whether the occurrence of an abnormal electric discharge and plasma concentration is none or within the acceptable range for each of HRF and LRF power. The HRF power ranges from 0 [W] to 2000 [W], and the LRF power ranges from 0 [W] to 110 [W]. Again, an area 120 shown therein denotes that the occurrence of an abnormal electric discharge and plasma concentration is zero or sufficiently low that it does not have a negative impact on the film quality, and an area 130 denotes the occurrence is outside of an acceptable range (e.g., the film quality becomes unstable). Although not shown in FIG. 10, an area 140 denotes the occurrence is clearly within an unacceptable range (e.g., the film quality becomes thus unacceptable).

In this example, while the area 120 is much more expanded and the area 130 is much more decreased as compared to the insulator structure as in FIG. 3 or FIG. 4, the area 140 completely disappears. As a result, it was confirmed that it more substantially eliminated the negative effect on the quality of deposited film caused by an abnormal electrical discharge and plasma concentration around those edges.

Example 3

Insulator structure as depicted in FIG. 7

A schematic view of an embodiment of an insulator structure for this example is shown in FIG. 7. In this example, the edge of the bottom surface of the upper electrode 12 is rounded or chamfered with a radius of 5 millimeters, and the position of the edge of the bottom surface of the projecting portion 341 is 1.2 millimeters below the position of the edge of the bottom surface of the upper electrode 12 in the vertical direction, and the edge portion on the bottom side of the insulator 34 extends 5.5 millimeters radially inwardly from the edge of the bottom surface of the insulator 34 as in FIG. 6 to from a projecting portion 341.

The projecting portion 341 has a thickness (F) of around 1 millimeter, and it is formed such that the projecting portion 341 covers an edge of the bottom side of the upper electrode 12 and has a clearance between the side wall of the upper electrode 12 and the side wall of the insulator 34. The distance (D) between the bottom surface of the upper electrode 12 and the top end surface of the projecting portion 341 is set to around 0.2 millimeters.

Figure 11:
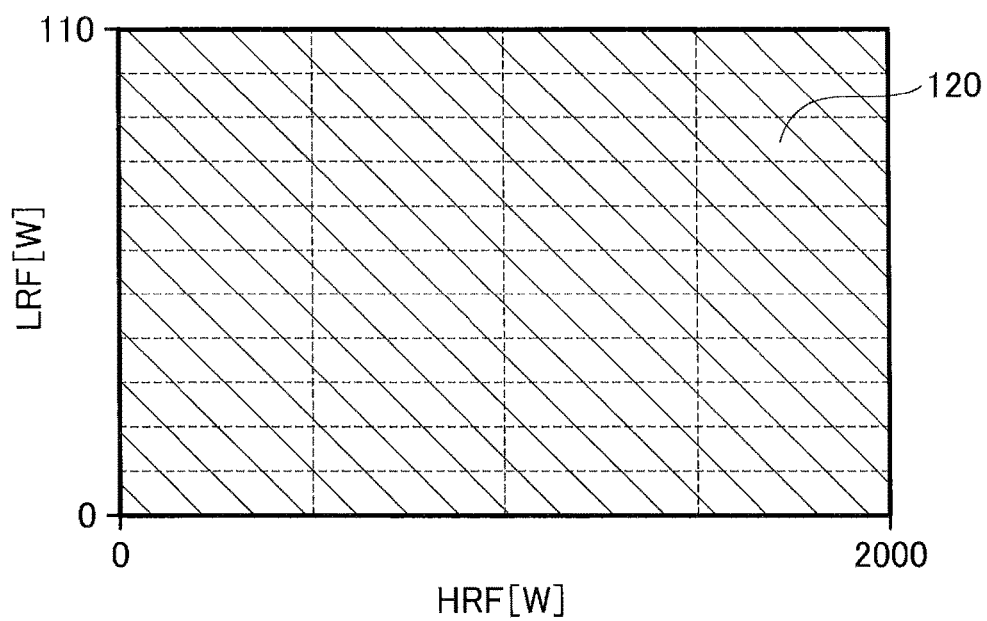
FIG. 11 is a graph showing the occurrence of an abnormal electric discharge and plasma concentration depending on each of HRF and LRF power according to an insulator structure of an embodiment.

In this example, a silicon nitride film was deposited on a substrate having recesses or grooves, and a capacitively coupled plasma (CCP) device was used as the ALD apparatus. The film deposition conditions were as follows:
Film deposition pressure: 480 Pa
Precursor: Si-containing precursor
Deposition time: 60 seconds
Flow rate of He: 300 sccm
Flow rate of $O_2$: 40 sccm
HRF power (27 MHz): 1000-1800 W
LRF power (300 kHz): 0-100 W FIG. 11 shows a graph showing whether the occurrence of an abnormal electric discharge and plasma concentration is none or within an acceptable range for each of HRF and LRF power. The HRF power ranges from 0 [W] to 2000 [VV], and the LRF power ranges from 0 [W] to 110 [W]. An area 120 shown therein denotes that the occurrence of an abnormal electric discharge and plasma concentration is zero or sufficiently low that it does not have a negative impact on the film quality.

As shown in FIG. 11, for all the HRF and LRH ranges, the occurrence of an abnormal electric discharge and plasma concentration is almost zero, and therefore it becomes the area 120 only, with no area 130 and no area 140. As a result, it was confirmed that it almost completely eliminated the negative effect on the quality of deposited film caused by an abnormal electrical discharge and plasma concentration around those edges.

With respect to the use of any plural and/or singular terms herein, those having skill in the art can translate from the plural to the singular and/or from the singular to the plural as is appropriate to the context.

Any discussion of the background art which has been included in the present disclosure is solely for the purpose of providing a context for the present invention, and it should not be taken as an admission that any or all of the discussion forms part of the prior art or was known in the art at the time the invention was made.

Although the system(s) and/or method(s) of this disclosure have been described in detail for the purpose of illustration based on what is currently considered to be the most practical and preferred implementations, it is to be understood that such detail is solely for that purpose and that the disclosure is not limited to the disclosed implementations, but, on the contrary, is intended to cover modifications and equivalent arrangements that are within the spirit and scope of the appended claims. For example, it is to be understood that the present disclosure contemplates that, to the extent possible, one or more features of any implementation can be combined with one or more features of any other implementation.

What is claimed is:

1. An insulator adapted to be installed in a plasma deposition or plasma etching apparatus, the plasma deposition or plasma etching apparatus comprising an upper electrode, a lower electrode and a reaction chamber, the insulator adapted to be arranged around the upper electrode and comprising:
a bottom end portion adapted to face the reaction chamber; and
a side wall configured to face a side wall of the upper electrode, the side wall of the upper electrode being at an angle to a bottom surface of the upper electrode,
wherein an edge portion of the bottom end portion of the insulator is arranged to extend inwardly toward a center part of the bottom surface of the upper electrode to form a projecting portion,
wherein at least part of the projecting portion is arranged to be located vertically underneath at least part of the upper electrode, and
wherein a portion of a surface, arranged to face upward toward the upper electrode, of the insulator is configured to form an open gap located vertically above the portion of the surface of the insulator, the open gap located between the upper electrode and the portion of the surface of the insulator.

2. The insulator of claim 1, wherein the projecting portion has a thickness selected from the range of about 0.5 to about 2.0 millimeters.

3. The insulator of claim 1, wherein, when the insulator is installed, a distance between the bottom surface of the upper electrode and a top end surface of the projecting portion is selected from the range of about 0.1 to about 1.0 millimeter.

4. The insulator of claim 1, wherein, when the insulator is installed, the position of a bottom surface of the projecting portion is selected from the range of about 0.6 to about 2.9 millimeters below the position of the bottom surface of the upper electrode in a direction perpendicular to the bottom surface of the upper electrode.

5. The insulator of claim 1, wherein, when the insulator is installed, the position of a bottom surface of the projecting portion is about 1.2 millimeters below the position of the bottom surface of the upper electrode in a direction perpendicular to the bottom surface of the upper electrode.

6. The insulator of claim 1, wherein the projecting portion projects about 5-25 millimeters inwardly such that the projecting portion covers the edge of the bottom surface of the upper electrode.

7. A substrate processing apparatus comprising the insulator of claim 1.

8. The substrate processing apparatus of claim 7, wherein the edge of the bottom surface of the upper electrode is rounded or chamfered.

9. The substrate processing apparatus of claim 7, wherein the edge of the bottom surface of the upper electrode is rounded or chamfered with a radius being the same as or more than the thickness of a sheath area generated within the reaction chamber.

10. The substrate processing apparatus of claim 7, wherein the edge of the bottom surface of the upper electrode is rounded or chamfered with a radius selected from the range of about 0.05 to about 10 millimeters.

11. The substrate processing apparatus of claim 7, wherein the edge of the bottom surface of the upper electrode is rounded or chamfered with a radius of about 5 millimeters.

12. A processing apparatus comprising:
an upper electrode having a side wall and a bottom surface, the side wall being at an angle to the bottom surface;
a lower electrode;
a workpiece support;
a reaction chamber; and
an insulator arranged around the upper electrode, the insulator comprising:
a bottom end portion adapted to face the reaction chamber, and
a side wall facing the side wall of the upper electrode,
wherein an edge portion of the bottom end portion of the insulator extends inwardly toward a center part of the bottom surface of the upper electrode to form a projecting portion protruding from the bottom end portion, at least part of the projecting portion located vertically underneath the upper electrode, and
wherein an open gap is located vertically above a portion of a surface, facing upward toward the upper electrode, of the insulator, the open gap located between the upper electrode and the portion of the surface of the insulator.

13. The processing apparatus of claim 12, wherein the position of a bottom surface of the projecting portion is selected from the range of about 0.6 to about 2.9 millimeters below the position of the bottom surface of the upper electrode in a direction perpendicular to the bottom surface of the upper electrode.

14. The processing apparatus of claim 12, wherein the position of a bottom surface of the projecting portion is about 1.2 millimeters below the position of the bottom surface of the upper electrode in a direction perpendicular to the bottom surface of the upper electrode.

15. The processing apparatus of claim 12, wherein the processing apparatus is configured for deposition or etching of a material on a workpiece.

16. The processing apparatus of claim 12, wherein the projecting portion has a thickness selected from the range of about 0.5 to about 2.0 millimeters.

17. The processing apparatus of claim 12, wherein a distance between the bottom surface of the upper electrode and a top end surface of the projecting portion is selected from the range of about 0.1 to about 1.0 millimeter.

18. The processing apparatus of claim 12, wherein the position of a bottom surface of the projecting portion is selected from the range of about 0.6 to about 2.9 millimeters below the position of the bottom surface of the upper electrode in a direction perpendicular to the bottom surface of the upper electrode.

19. The processing apparatus of claim 12, wherein the projecting portion projects about 5-25 millimeters inwardly such that the projecting portion covers the edge of the bottom surface of the upper electrode.

20. The processing apparatus of claim 12, wherein the edge of the bottom surface of the upper electrode is rounded or chamfered with a radius selected from the range of about 0.05 to about 10 millimeters.

* * * * *